United States Patent [19]

Yokogawa et al.

[11] Patent Number: 4,872,155
[45] Date of Patent: Oct. 3, 1989

[54] CLOCK GENERATOR CIRCUIT AND A SYNCHRONIZING SIGNAL DETECTION METHOD IN A SAMPLED FORMAT SYSTEM AND A PHASE COMPARATOR CIRCUIT SUITED FOR GENERATION OF THE CLOCK

[75] Inventors: Fumihiko Yokogawa; Hiroyuki Hirano; Keiji Kinpara, all of Tokorozawa, Japan

[73] Assignee: Pioneer Electronic Corporation, Tokyo, Japan

[21] Appl. No.: 162,625

[22] Filed: Mar. 1, 1988

[30] Foreign Application Priority Data

Mar. 13, 1987 [JP] Japan .................................. 62-59749
Mar. 13, 1987 [JP] Japan .................................. 62-59746
Sep. 16, 1987 [JP] Japan .................................. 62-231748
Dec. 17, 1987 [JP] Japan .................................. 62-319563

[51] Int. Cl.$^4$ .............................................. G11B 5/76
[52] U.S. Cl. ..................................... 369/59; 331/1 R; 324/83 R; 375/113
[58] Field of Search ............................. 369/59, 47-49; 360/51

[56] References Cited

U.S. PATENT DOCUMENTS 4,713,802 12/1987 Kobata et al. ...................... 369/59

Primary Examiner—Vincent P. Canney
Attorney, Agent, or Firm—Fleit, Jacobson, Cohn, Price, Holman & Stern

[57] ABSTRACT

A recording-reproducing clock generator circuit generates a reproduced clock having a predetermined frequency from a read out signal including such pulses that the interval between two successive pulses thereof at a predetermined length is to be used as a synchronizing signal region. The circuit generates a reference clock of a predetermined frequency, generates a first sync signal detection signal when the distance between two successive pulses in the input signal measured by means of the clock pulses is equal to a predetermined reference value, separates a clock edge pulse from the input signal by using the first sync signal detection signal, and generates the reproduced clock having the predetermined frequency and synchronized with the separated clock edge pulse.

3 Claims, 11 Drawing Sheets

CLOCK GENERATOR CIRCUIT AND A SYNCHRONIZING SIGNAL DETECTION METHOD IN A SAMPLED FORMAT SYSTEM AND A PHASE COMPARATOR CIRCUIT SUITED FOR GENERATION OF THE CLOCK

BACKGROUND OF THE INVENTION

1. Field of the Invention

The present invention relates to a clock generator circuit for recording and reproduction of data, and more particularly to a clock generator circuit for generating a clock for the recording and reproduction of data in a sampled format system. The present invention also relates to a synchronizing signal detection method in the sampled format system and a phase comparator circuit suited for use in the generation of the clock.

2. Description of Background Information

On an optical disk such as, for example, one called a DRAW (Direct Read After Write) disk, there are recorded servo bytes as shown in FIG. 1. Each sector of the optical disk is made up of 48 servo blocks, and each servo block is formed of two bytes of servo bytes and 16 bytes of data bytes disposed in succession thereto. A servo byte is formed of two wobbled pits and one clock pit, the wobbled pits being disposed on left and right sides of the track center. When the information detecting point of the pickup (the light spot for detecting information) traces the center of the track, reductions in the quantity of light at the left and right wobbled pits become equal. However, when the tracing position is shifted to the left or right, the reductions in the quantity of the light becomes different depending upon the direction and magnitude of the shifted amount. Therefore, a tracking error signal can be generated from the difference between the reductions (the difference between levels of RF signals) at two positions and this tracking error signal is maintained during the period of the succeeding data byte.

The pairs of wobbled pits are arranged such that their spacings change between longer and shorter ones every 16 tracks. By detecting the change in the spacing, it is possible, even in a high-speed search mode to count the number of tracks correctly (16-track counting). Further, the distance D between the wobbled pit located in the rear and a clock bit is set to be a particular distance which will not appear in the data bytes. Therefore, the distance D can be detected as a synchronizing signal. Various timing signals are generated based upon the detected synchronizing signal. A clock is generated according to a detected signal of the clock pits. The mirror portion having the distance D is designated as a focus area wherefrom a focus error signal is detected, and which is maintained during the period of the succeeding data byte.

When, for example, a 5-inch DRAW disk with servo bytes recorded thereon is rotated at 1800 rpm, the edges generated in the RF signal by the clock pits has a repetition frequency of 41 28 KHz.

A clock generator circuit for generating a clock for reproducing the data recorded on such a DRAW disk in succession to the servo bytes, is shown in FIG. 2.

Referring to FIG. 2, an RF signal obtained from the disk (not shown) by a pickup 1 is supplied, after being amplified by a head amplifier 2, to a differentiating edge detector circuit 3. The differentiating edge detector circuit 8 is adapted to differentiate the RF signal for detecting edges in the signal and to output an edge pulse signal a formed of a train of pulses corresponding to the edges. This edge pulse signal a outputted from the differentiating edge detector circuit 3 is supplied to a synchronizing signal detector circuit 4 and also to one input terminal of an AND (logical product) gate 5. The sync detector circuit 4 is supplied with a reproduced clock from a PLL (Phase Locked Loop) circuit generally denoted at 6. The sync detector circuit 4 is adapted to measure the spacing between two successive pulses in the edge pulse a by, for example, counting the reproduced clock pulses during that interval and to generate a sync signal detection signal b When the obtained measurement value becomes equal to a predetermined value. The sync signal detection signal b is supplied to a gate pulse generator circuit 7. The gate pulse generator circuit 7 is adapted to generate a clock gate pulse c having a width corresponding to a predetermined length of time at the time point when a predetermined period of time has elapsed after the sync signal detection signal b was outputted according to the reproduced clock e from the PLL circuit 6. The clock gate pulse c outputted from the gate pulse generator circuit 7 is supplied to the other input terminal of the AND gate 5.

An output d of the AND gate 5 is supplied to a phase comparator circuit 8 of the PLL circuit 6. The phase comparator circuit 8 compares the phases of the output of the AND gate 5 and output of a frequency divider circuit and supplies the result of the phase comparison to a low-pass filter (hereinafter, to be called LPF) 10. The signal smoothed by the LPF 10 is supplied to a voltage-controlled oscillator (hereinafter, referred to as VCO) 11 as a control signal therefor. From the VCO 11, the reproduced clock e, (for example, at 11.1456 MHz) at the phase corresponding to the control voltage, is output. The reproduced clock e whose frequency then divided by 270 in the frequency divider circuit 9 is supplied to the phase comparator circuit 8 as a signal at 41.28 KHz.

This PLL circuit 6 is extracted as FIG. 3, and the circuit portion which generates the clock data shown in FIG. 3 is extracted as FIG. 4.

With the above described arrangement, as the light spot of the pickup 1 traces the servo byte, the level of the RF signal is lowered to the level where there are the pits, and therefore, the edge pulse a corresponding to the positions of the pits as shown in FIG. 5(a) is output from the differentiating edge detector circuit 3. When the pulse spacing of the edge pulse a becomes equal to the distance D, the sync signal detection signal b is output from the sync detector circuit 4. With reference to this sync signal detection signal b, the gate pulse c as shown in FIG. 5(b) for gating the clock edge pulse generated correspondingly to the clock pit is output from the gate pulse generator circuit 7. As the edge pulse a and the gate pulse c are supplied to the AND gate 5, only a clock edge pulse d corresponding to the clock pit as shown in FIG. 5(c) is separated and supplied to the phase comparator circuit 8 of the PLL circuit 6. As a result, the reproduced clock e at, for example 11.1456 MHz in synchronism with the clock edge pulse d, is generated by the pLL circuit 6.

Now, if a 5-inch DRAW disk is rotated at 1800 rpm, the repetition frequency of the clock pits (clock edge pulses) becomes 41.28 KHz. When the pulse width of the pulse train of the clock edge pulses is made to be a half clock (approximately 45 nanoseconds), its spectrum becomes such as that shown in FIG. 6, that is, an arrangement of discrete energy distributions at intervals of a sampling frequency of 41.28 KHz in preceding and following the clock frequency 11.1456 MHz is obtained. If the pulse widths are varied, the spectrum becomes such as that shown in FIG. 7.

In the conventional clock generator circuit of FIG. 2, since the phase comparison of input signals at the same frequency is performed in the phase comparator circuit 8, there is no danger of mis-locking the signal onto a spectrum of 11.1456 MHz±41.28 N MHz (N is an integer). However, since the accuracy of the phase comparator circuit 8 is 1/270, there is a problem of increased jitters in the clock. Besides, since the detection of the synchronizing signal is performed according to the reproduced clock output from the PLL circuit 6, and further, since the gate pulse for selecting the clock edge pulse to be supplied to the PLL circuit 6 is generated according to the aforesaid synchronizing signal, detection of the synchronizing signal cannot be performed in a stable manner at the time of starting up and a considerable time is taken before the PLL circuit 6 locks, and thus, there is a problem that a stable startup is unachievable.

In addition, since the phase comparison is made with the output of divided frequency from the frequency divider circuit 9, the sensitivity of the phase is lowered to 1/270 and becomes ineffective against any shift of frequency due to drift or the like in the voltage-controlled oscillator circuit 11, and therefore, there is a disadvantage that the relative phase between the clock and the clock data tends to be shifted due to change in temperature or the like.

When the 5-inch DRAW disk with the servo bytes recorded thereon is rotated at 1800 rpm as mentioned before, the edge information of the clock pit is detected at a repetition frequency of 41.28 KHz. Since the edge information of such a signal is only of a single edge, it cannot be compared in phase with a reference signal in the same way as ordinary continuous signals or burst signals continuing for a certain length of time.

In a servo byte region of an optical disk of the sampled format system, there are previously provided, as pre-pits, pits for tracking and pits acting as a synchronizing signal. Of these, the synchronizing signal is formed of a first byte of 8 ch (channel) pits and a second byte of 12 ch pits and the distance between the two is made to be 19 ch clock. Since the data are made to be smaller than 18 ch clock, the pits at the distance of 19 ch clock are detected as the synchronizing signal.

FIG. 8 is a block diagram showing a prior art synchronizing signal detection apparatus. An RF signal (FIG. 9(*a*)) reproduced and output from an optical disk (not shown) is differentiated and an edge pulse (FIG. 9(*b*)) corresponding to the pre-pits is thereby generated. The edge pulse is input to a counter 12. Upon loading of the edge pulse in the counter 12, counting of a clock input thereto is started after the value of the count made up to that time has been reset. A window decoder 13 outputs a window pulse during the interval from the point when the count value of the counter 12 has become 18 (=19−1) to the point when it exceeds 20 (=19+1). When the 12 ch edge pulse is input at the time point when 19 clock period has elapsed after the 8 ch edge pulse was input, an AND gate 14 is rendered conductive and a sync signal detection signal is output.

In the case where the distance between two edge pulses is shorter than 19 ch clock, the counter 12 is loaded again upon receipt of the second edge pulse and the count value is reset. And, in the case where the distance is longer than 19 ch clock, an overflow signal is output from the window decoder 13 and the counting operation of the counter 12 is inhibited. Then, the counter 12 is loaded again when the next edge pulse is input thereto. Thus, the sync signal detection signal is not outputted when the distance is deferent from the synchronizing signal.

Since the conventional apparatus detects the synchronizing signal in the described manner, there is a disadvantage that the apparatus becomes unable to detect the synchronizing signal when, for example, a pulse due to noises, defects, or the like is produced between the two edge pulses constituting the synchronizing signal as typically illustrated in FIG. 9(*c*) and (*d*).

OBJECTS AND SUMMARY OF THE INVENTION

The present invention is made in view of the aforementioned problems and accordingly an object of the present invention is to provide a recording-reproducing clock generator circuit enabled to make a stable startup.

Another object of the present invention is to keep the relative phase from being shifted by change in temperature or the like and to enable the clock to be generated correctly.

A further object of the present invention is to provide a phase comparator circuit capable of phase comparison of a single having only single edge information.

A still further object of the present invention is to provide a synchronizing signal detector capable of detecting the synchronizing signal accurately even if defects or the like are present.

The recording-reproducing clock generator circuit of the present invention is adapted to generate a reference clock having a predetermined frequency, generate a first sync signal detection signal when the value of the distance, measured in the clock pulses, between two successive pulses in the input signal is equal to a predetermined reference value, output a clock edge pulse separated from the input signal by using the first sync signal detection signal, and generate a reproduced clock having a predetermined frequency whose generation timing is synchronized with the separated clock edge pulse.

According to a second feature of the present invention, a PLL circuit including a phase comparator circuit for comparing phases of clock data and a clock whose frequency is different from that of the clock data is supplied with a signal corresponding to the pulse spacing of the clock data. Specifically, the clock generator circuit according to the second feature of the present invention comprises a PLL circuit consisting of a phase comparator circuit for comparing phases of clock data and a clock at a frequency different from that of the clock data, a low-pass filter for smoothing the output of the phase comparator circuit, and a voltage-controlled oscillator circuit controlled in response to the output of the low-pass filter for generating the clock, a counter detecting the pulse spacing of the clock data or a signal synchronized with the clock data by counting the clock pulses, and a supply circuit for supplying the PLL circuit with a signal corresponding to the count value of the counter.

The phase comparator circuit compares phases of the clock data and the clock. The phases of the clock data and the clock are different from each other. The output of the phase comparator circuit is smoothed by the low-pass filter and supplied to the voltage controlled oscillator circuit. The clock output from the voltage-controlled oscillator circuit is input to the phase comparator circuit. The PLL circuit generating the clock in synchronism with the clock data is constructed of these circuits.

The clock data or a signal synchronized therewith and the clock are input to the counter, and the pulse spacing of the signal is detected by counting the clock pulses. Output of the counter is supplied through the supply circuit to the PLL circuit.

According to a third feature of the present invention, comparison of an input signal is performed by means of a flip-flop and two latch circuits.

Specifically, a phase comparator circuit according to the third feature of the present invention, is characterized in that it comprises a flip-flop to be set by an input signal, a first latch circuit for latching an output of the flip-flop at the timing of one edge of a clock, a second latch circuit for latching an output of the first latch circuit at the timing of the other edge of the clock, a first generator circuit for generating, from the outputs of the flip-flop and of the first latch circuit, a first pulse corresponding to information related to the time difference between the input signal and the clock, and a second generator circuit for generating, from the outputs of the first latch circuit and of the second latch circuit, a second pulse corresponding to the width between one edge and the other edge of the clock.

An input signal sets a flip-flop and a first latch circuit latches an output of the flip-flop at the timing of one edge of a clock A second latch circuit latches an output of the first latch circuit at the timing of the other edge of the clock. A first generator circuit generates, from the output of the flip-flop and the output of the first latch circuit, a first pulse corresponding to information about the time difference between the input signal and the clock. A second generator circuit generates, from the output of the first latch circuit and the output of the second latch circuit, a second pulse corresponding to the width between one edge and the other edge of the clock.

According to the fourth feature of the present invention, for detecting a synchronizing signal through comparison of the distance between two edge pulses of an input signal with a reference distance, the middle portion between the two edge pulses is masked while the synchronizing signal is detected in a stable manner.

Specifically, in a synchronizing signal detection system detecting the distance between a first edge pulse and a second edge pulse of an input signal and detecting the distance as the synchronizing signal when the distance is equal to a predetermined reference distance, is characterized in that it performs detection of the synchronizing signal with a predetermined interval between the first edge pulse and the second edge pulse masked when the synchronizing signal is stably detected but with the interval unmasked when the signal is not stably detected.

Edge pulses of an input signal are detected and the distances between the edge pulses are determined, and when the distance between a first edge pulse and a second edge pulse is equal to a predetermined reference distance, a detection signal of synchronizing signal is output.

In the state of the apparatus stably detecting the synchronizing signal, any edge pulse present between the first edge pulse and the second edge pulse is masked. When it is not stably detecting the synchronizing signal because it is in the stage of initialization, the masking is not made.

Therefore, erroneous detection of the data as synchronizing signal is prevented and it becomes possible to make a stable detection of the synchronizing signal even if any edge pulse is produced in the middle of the reference distance due to defects or the like in the disk.

DETAILED DESCRIPTION OF PREFERRED EMBODIMENTS

A first embodiment of the clock generator circuit according to the present invention will be described in detail with reference to FIG. 10 in the following.

Figure 1:
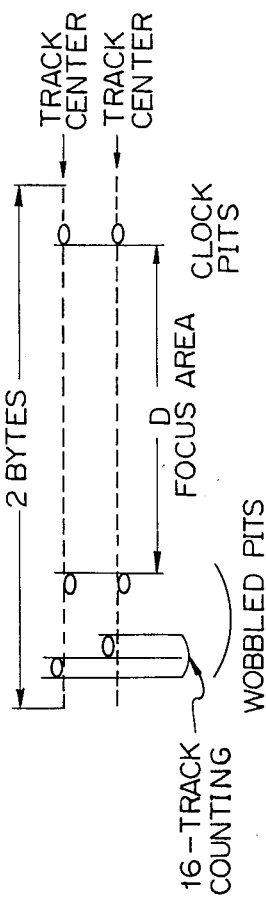
FIG. 1 is an explanatory diagram showing the arrangement of servo bytes in an optical disk.
Figure 2:
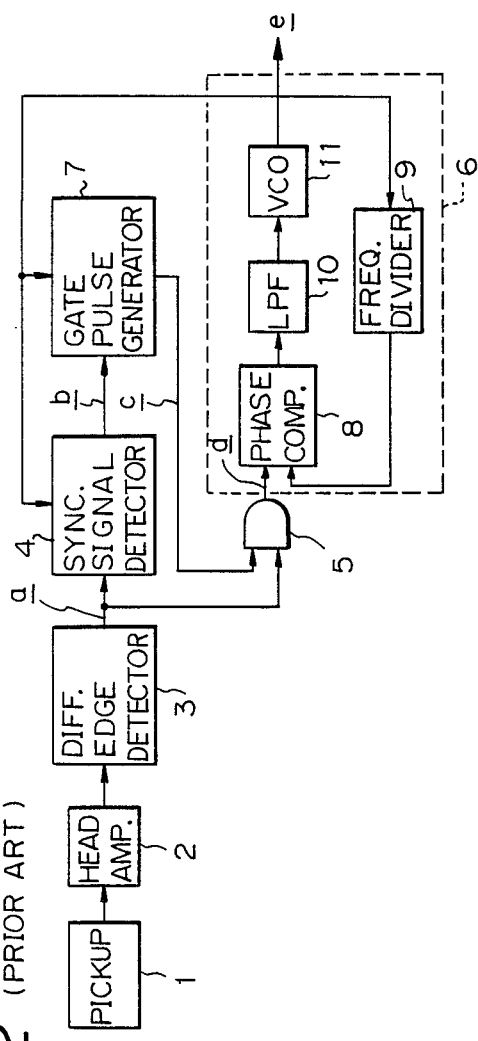
FIG. 2 is a block diagram showing the construction of a conventional clock generator circuit.
Figure 10:
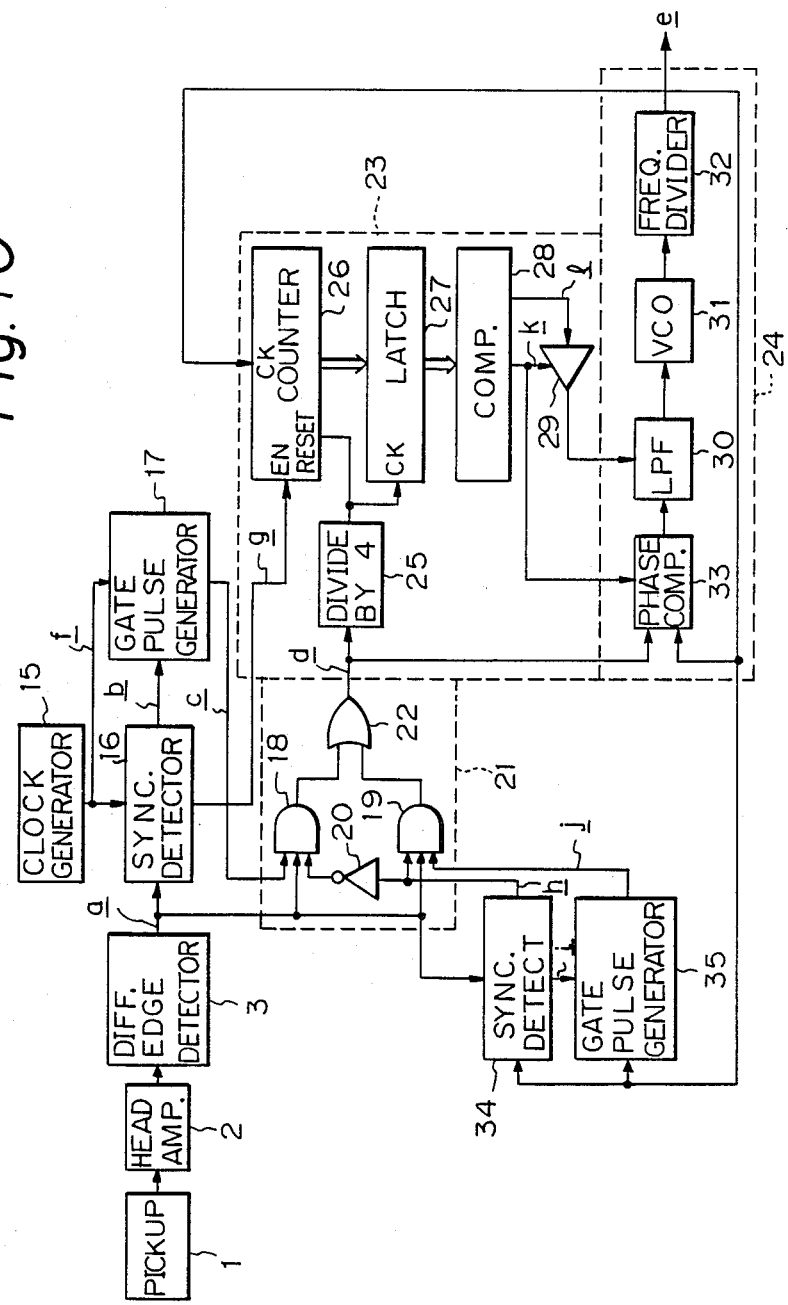
FIG. 10 is a block diagram showing a first embodiment of the clock generator circuit according to the present invention.

Referring to FIG. 10, the pickup 1, head amplifier 2, differentiating edge detector circuit 3, sync detector circuit 16, and the gate pulse generator circuit 17 are connected in the same way as in the apparatus of FIG. 2. In the present example, however, the sync detector circuit 16 and the gate pulse generator circuit 17 are supplied with a master clock f from a clock generator circuit 15, for example, made up of a quartz oscillator. The sync detector circuit 16 includes, in addition to the arrangement in the circuit of FIG. 2, a circuit generating a synchronization completion signal g when the number of the sync signal detection signals b successively output at intervals of a predetermined period of time becomes a predetermined number. The edge pulse a output from the differentiating edge detector circuit 8 is supplied to a clock edge selector circuit 21 and a sync detector circuit 34. In the clock edge selector circuit 21, the edge pulse a is made to be one of the inputs to the three-input AND gates 18 and 19. The AND gate 18 is supplied with the gate pulse c output from the gate pulse generator circuit 17 and also with a synchronization completion signal h output from the sync detector circuit 34 through an invertor 20. The synchronization completion signal h is directly input to the three-input AND gate 19. The AND gate 19 is supplied with a gate pulse j output from a gate pulse generator circuit 35. Outputs of the AND gates 18 and 19 are Passed through an OR (logical sum) gate 22 and supplied as the output of the clock edge selector circuit 21 to a clock detector circuit 23.

The sync detector circuit 34 is adapted to detect the synchronizing signal from the edge pulse a according to the reproduced clock e output from a PLL circuit 24 thereby to generate a sync signal detection signal i and also to output a synchronization completion signal h when the number of times of the sync signal detection signals is successively output at intervals of a predetermined period of time becomes a predetermined number. The sync signal detection signal i output from the sync detector circuit 34 is supplied to the gate pulse generator circuit 35. The gate pulse generator circuit 35, like the gate pulse generator circuit 34, is adapted to generate the gate pulse j having a predetermined width at the time point when a predetermined period of time has elapsed after the sync signal detection signal i was output according to the reproduced clock e from the PLL circuit 24.

On the other hand, the output of the clock edge selector circuit 21 is supplied to the lock detector circuit 28 and the pLL circuit 24. In the lock detector circuit 23, the output of the clock edge selector circuit 21 is supplied to a divide-by-four circuit 25. The divide-by-four circuit 25 is adapted to output a pulse of a predetermined width at the timing of the output of the clock edge selector circuit 21 divided by four. The output pulse of the divide-by-four circuit 25 is supplied to the reset input terminal of a counter 26. The enable input terminal of the counter 26 is supplied with the synchronization completion signal g output from the sync detector circuit 16 and its clock input terminal is supplied with the reproduced clock e. The counter 26 is adapted such that its count value gradually changes according to the reproduced clock e and this count value is reset at the timing of the trailing edge of the output pulse of the divide-by-four circuit 25. Output of the counter 26 is supplied to a latch circuit 27. The clock input terminal of the latch circuit 27 is supplied with the output pulse of the divide-by-four circuit 25, and at the timing of the trailing edge of this output pulse, the output data of the counter 26 is latched in the latch circuit 27. The latched value $C_X$ in the latch circuit 27 is compared with predetermined reference values in a comparator circuit 28. The comparator circuit 28 is adapted to output a frequency error signal l corresponding to the count value $C_X$ and also to output a high level lock detection signal k when the count value is over $C_A$ and under $C_B$ (where $C_A < C_B$). The lock detection signal k output from the comparator circuit 28 is supplied to the control input terminal of a three-state buffer 29 and a phase comparator circuit 33 of the PLL circuit 24. The buffer 29 is put in an open state when the control input goes to the high level. The buffer 29 is supplied, at its input terminal, with the frequency error signal l output from the comparator circuit 28. The buffer 29, when the control input goes to the low level, supplies the generated frequency error signal l to an LPF 80 in the PLL circuit 24. The phase comparator circuit 33 is adapted to be in an open state when the control signal k is at low level so as not to deliver its output.

In the PLL circuit 24, the output of the clock edge selector circuit 21 and the reproduced clock e output from a frequency divider circuit 82 are supplied to the phase comparator circuit 33 for phase comparison, whereby a differential phase signal corresponding to the phase difference between these signals is generated. A phase comparator circuit, such as the one disclosed in Japanese Patent Application No. 62-89746 can be used.

The output of the phase comparator circuit 33 is smoothed by the LPF 30 and supplied to a VCO 31 as the control signal therefor. The clock generated by the VCO 31 at the phase corresponding to the control signal is subjected to frequency division by two in the frequency divider circuit 32 and output as the reproduced clock e, and also, supplied to the phase comparison circuit 33.

With the above described arrangement, when the edge pulse a is started to be output from the differentiating edge detector circuit 3 at the time point when the reading of the disk is started, the synchronizing signal is immediately detected in the sync detector circuit 4 according to the stable master clock f output from the clock generator circuit 15, and thereby, a sync signal detection signal b is output. When the sync signal detection signals b has been generated a predetermined number of times, the synchronization completion signal g is output. As the synchronization completion signal g is supplied to the counter 26, this counter 26 starts its counting operation.

On the other hand, in the sync detector circuit 34, the detection of the synchronizing signal is not performed when the PLL circuit 24 for outputting the reproduced clock e is not in its lock state, and hence, the synchronization completion signal h is not output Therefore, at this time, the clock edge pulse d separated from the edge pulse a in the clock edge selector circuit 21 according to the gate pulse c output from the gate pulse generator circuit 17 is selectively output through the AND gate 18. This clock edge pulse d is supplied to the phase comparator circuit 33 of the PLL circuit 24 and thereby the reproduced clock e is generated.

As the clock edge pulse d after its frequency has been divided by four by the divide-by-four circuit 25 is supplied to the counter 26 and the latch circuit 27, the count data corresponding to the distance between the clock edge pulses d (virtually the same as the pulse spacing of the synchronizing signal) is retained in the latch circuit 27. Since the clock frequency is 11.1456 MHz in this case, the spacing between the clock edge pulses corresponds to 270 clock pulses in the normal state. As being divided by four, the count value retained in the latch circuit 27 becomes 1080 ±M, and therefore, if the lock range of the PLL circuit 24 is set to be from 1077 to 1083, the count value $C_X$ less than 1077, or more than 1083, indicates an off-the-lock state.

The count value $C_X$ latched in the latch circuit 27 is compared with reference values in the comparator circuit 2B. By setting now $C_A=1077$, $C_B=1083$, if the count value $C_X$ is between 1077 and 1083, the lock detection signal k is output from the comparator circuit 28 and supplied to the buffer 29. If then the lock detection signal k at high level is supplied to the buffer 29 as the control signal therefor, the buffer 29 is put in an open state, whereby no frequency error signal l is output to the LPF 30.

If a signal at low level is supplied to the control input terminal of the buffer 29, the buffer 29 is put in an enabled state. At this time, the comparator circuit 28, when the count value $C_X$ is below 1077, for example, outputs a signal at low level as the frequency error signal l and thereby causes the buffer 29 to output a signal at low level. When the $C_X$ is above 1088, the comparator circuit 28 outputs a signal at high level as the frequency error signal l thereby causes the buffer 29 to output the signal at low level. The output of the buffer 29 is supplied through the LPF 30 to the VCO 31 so that its oscillating frequency is changed.

Under the condition in which no locking is detected, the output of the phase comparator circuit 33 is put in the open state in response to the output from the buffer 29. As a result, the PLL circuit 24 upon receipt of the output from the buffer 29 is quickly driven to the frequency within the lock range. Although the phase comparator circuit 33 compares the phases of the data clock and the reproduced clock whose frequencies are different from each other, mis-locking onto a different spectrum is prevented since the PLL circuit 24 has the frequency control loop.

Figure 11:
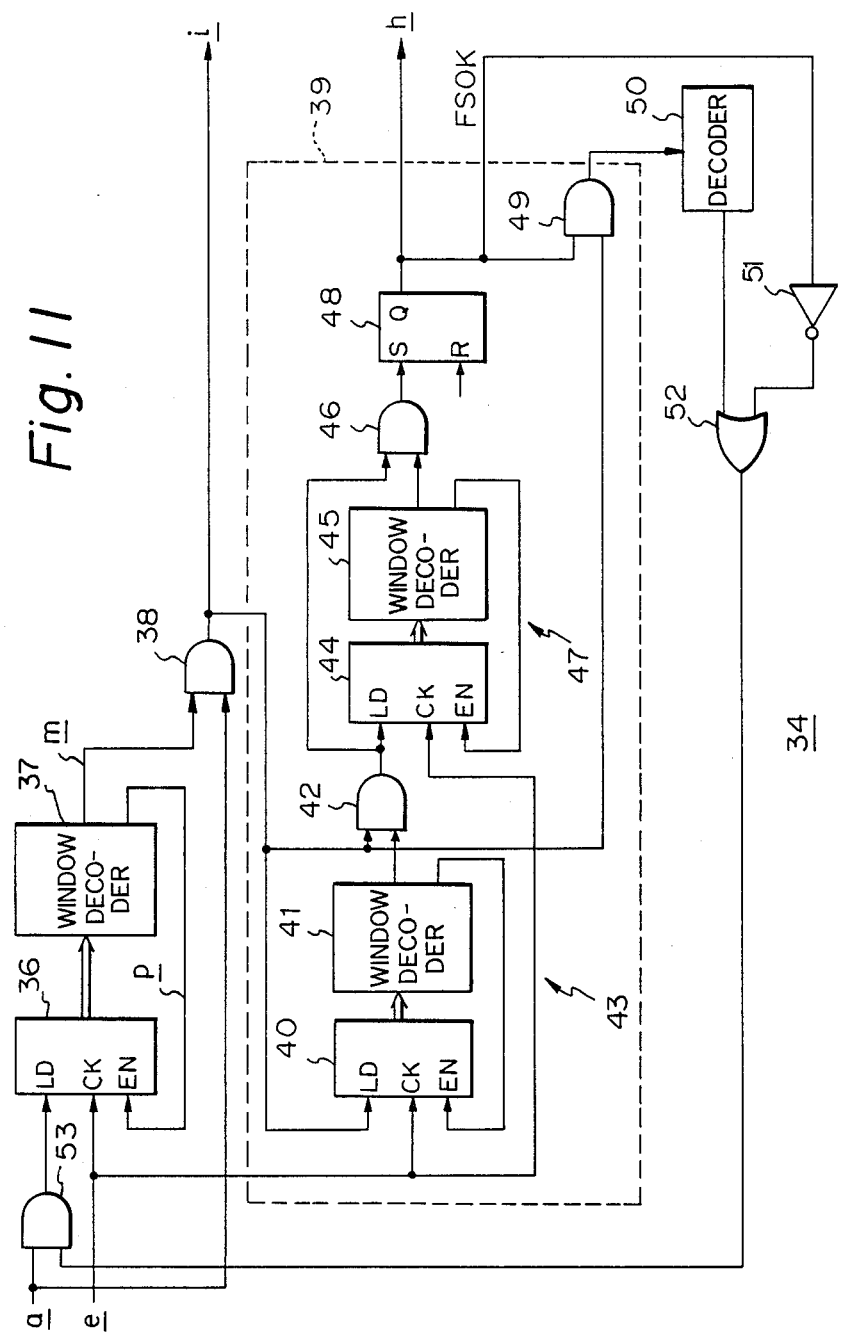
FIG. 11 is a circuit diagram showing an example of the synchronization detection circuit to be used in the circuit of FIG. 10.

FIG. 11 is a drawing showing a particular example of the sync detector circuit 34 in the circuit of FIG. 10. Referring to the figure, the edge pulse a is supplied through an AND gate 53 to a counter 36. The counter 36 when the edge pulse c is supplied thereto resets the value counted thereby up to that time and starts new counting of the reproduced clock pulses e input thereto. A window decoder 37 outputs a window pulse m during the interval from the point when, for example, the count value of the counter 36 has become 18 ($=19-1$) to the point when it exceeds 20 ($=19+1$). When 12 ch edge pulse is input at the time when 19 ch clock period has elapsed after 8 ch edge pulse was input, an AND gate 38 is rendered conductive and the sync signal detection signal i is outputed.

In the case where the distance between two edge pulses is shorter than 19 ch clock, the counter 36 is loaded again upon receipt of the second edge pulse and the count value is reset. And, in the case where the distance is longer than 19 ch clock, an overflow signal p is output from the window decoder 37 and the counting operation of the counter 36 is inhibited. Then, the counter 36 is loaded again when the next edge pulse is input thereto. Thus, the sync signal detection signal i is not output when the distance is different from the synchronizing signal.

The sync signal detection signal i is supplied to a protection circuit 39. The protection circuit 39 is made up of a first circuit 43 consisting of a counter 40, window decoder 41, and an AND gate 42, a second circuit 47 consisting of a counter 44, window decoder 45, and an AND gate 46, and an R-S flip-flop 48 pulse an AND gate 49. Basically, the circuits 45 and 47 are organized similarly to the circuit consisting of the counter 36, window decoder 37 and the AND gate 38 and the circuit shown in FIG. B. However, the window decoders 41, 45 are provided with 270±1 ch clock, the distance between the servo bytes, as the reference distance.

The counter 40, when the syn signal detection signal i is supplied from the AND gate 38, starts counting the reproduced clock e. The window decoder 41 is adapted to output a window signal at high level when the counted value by the counter 40 is 269, 270, or 271. Therefore, the AND gate 42 outputs a signal at high level when the distance between two successive sync signal detection signals i is 270 ch clock. Thus, the distance between the synchronizing signals can be detected by the circuit 43.

When the signal at high level outputted from the AND gate 42 is supplied to the counter 44, the counter 44 starts counting the clock. The window decoder 45 is adapted to output a window signal at high level when the counted value by the counter 44 is 269, 270, or 271. Therefore, the AND gate 46 outputs a signal at high level when the distance between two successive outputs of the AND gate 42 is 270 ch clock. Thus, it is determined by the circuit 47 whether or not the synchronizing signals at the proper distance are detected two times in succession.

When the signal at high level from the AND gate is input, the R-S flip-flop 48 is set, whereby the synchronization completion signal h at high level is output from its Q output terminal. When the flip-flop 48 is set, whose Q output is made to be on input of the AND gate 49, the synchronization completion signal h is output as it is from the AND gate 49 to a decoder 50. When the synchronization completion signal h from the AND gate 49 is input, the decoder 50 outputs a window pulse of a predetermined width, with reference to the position thereof (the position of the synchronizing signal), at the timing of the 8 ch edge pulse of the following servo byte. Since the output of an invertor 51 goes to low level when the flip-flop 48 is set, the output of the decoder 50 is supplied through an OR gate 52 to the AND gate 53. Hence, thereafter, the AND gate 53 allows only 8 ch edge pulses and 12 ch edge pulses to pass therethrough while masking all other edge pulses.

At the time of initialization of the apparatus such as immediately after it has been started to be driven, the synchronizing signal cannot be stably detected. At this time, the synchronization detection signal h (FSOK) output from the protection circuit 39 is kept at logical L. Hence, a signal at logical H is input through the invertor 51 and the OR gate 52 to an AND gate 53. As a result, the edge pulse input to the AND gate 53 is supplied to the counter 36 as it is. Thus, the synchronizing signal is detected, similarly to the previously described case, by the circuit consisting of the counter 86, window decoder 87, and the AND gate 38.

In the circuit of FIG. 11 as described in the foregoing, it is adapted such that edge pulses in the middle of the synchronizing signal are masked while the synchronizing signal is stably detected but no masking is applied while the signal is not stably detected, for example, during the time of starting up. Therefore, such a problem is prevented that data is mistaken for the synchronizing signal and much time is therefore taken for detecting the correct synchronizing signal and such possibility is reduced that detection of a synchronizing signal becomes impossible due to pulses resulting from noises, defects, or the like.

The flip-flop 48 is adapted to be reset by a reset pulse during the time of initialization, so that the portion (mirror portion) in the middle of the two edge pulses constituting the synchronizing signal is not masked during the initialization period. This is because, if the portion in the middle of the two edge pulses were masked also during the initialization period, it would follow that a data signal is mistaken for a synchronizing signal and much time is taken before a correct detection is achieved.

Although, in the arrangement of FIG. 10, it is adapted such that the sync detection stage consisting of the sync detector circuit 16 and the gate pulse generator circuit 17 are supplied with the master clock f from the clock generator circuit 15, the free run frequency of the VCO 31 as it is may be used instead, if the free-running frequency of the VCO 31 is adjusted to the reference frequency and the drift due to temperature change or the like is sufficiently small.

The first embodiment of the clock generator circuit according to the present invention as described in detail so far is adapted to generate a reference clock at a predetermined frequency, generate a first sync signal detection signal when the value of the distance between two successive pulses in the input signal measured in the reference clock pulses is equal to a predetermined reference value, output clock edge pulses in the input signal separated therefrom according to the first sync signal detection signal, and generate a reproduced clock at a predetermined frequency concurring, in timing of generation, with the separated clock edge pulses, and therefore, by virtue of the reference clock, the detection of the synchronizing signal can be performed stably even in the startup period, a considerable tolerance on the variation in the width of the data, or variation in the number of revolutions of the spindle, can be obtained and a stable startup can be achieved.

In the synchronizing signal signal detection method according to the present invention as described so far, it is adapted such that edge pulses in the middle of the synchronizing signal are masked while the synchronizing signal is stably detected but no mask is applied while the signal is not stably detected. Therefore, such a problem is prevented that data is mistaken for the synchronizing signal and much time is therefore taken for detecting the correct synchronizing signal and the possibility is reduced that detection of a synchronizing signal becomes unattainable due to pulses resulting from noises, defects, or the like.

Figure 12:
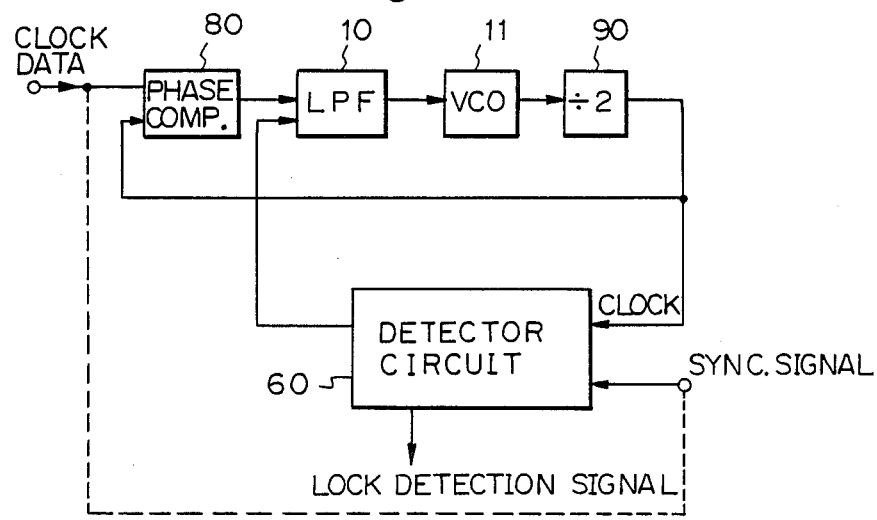
FIG. 12 is a block diagram showing a second embodiment of the clock generator circuit according to the present invention.

Referring next to FIG. 12, the second embodiment of the clock generator circuit according to the present invention will be explained.

Figure 3:
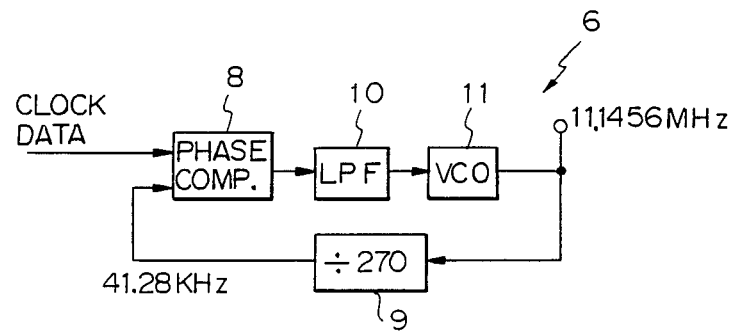
FIG. 3 is a diagram illustrating the PLL circuit portion of the clock generator circuit shown in FIG. 2.
Figure 4:
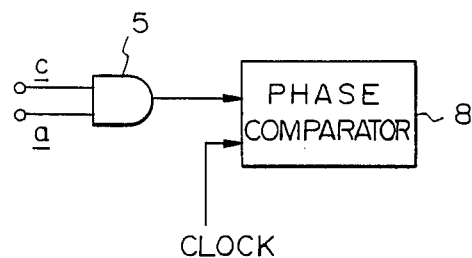
FIG. 4 is a diagram illustrating the clock data generation circuit portion of the clock generator circuit shown in FIG. 2.
Figure 5:
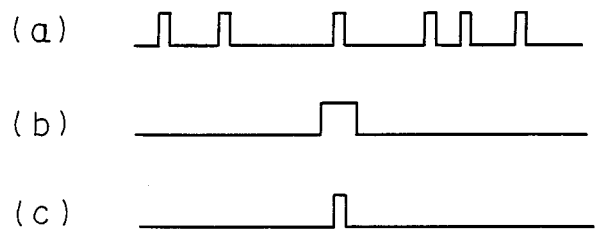
FIGS. 5a through c is a timing chart showing the operation of the clock generator circuit shown in FIG. 2.
Figure 6:
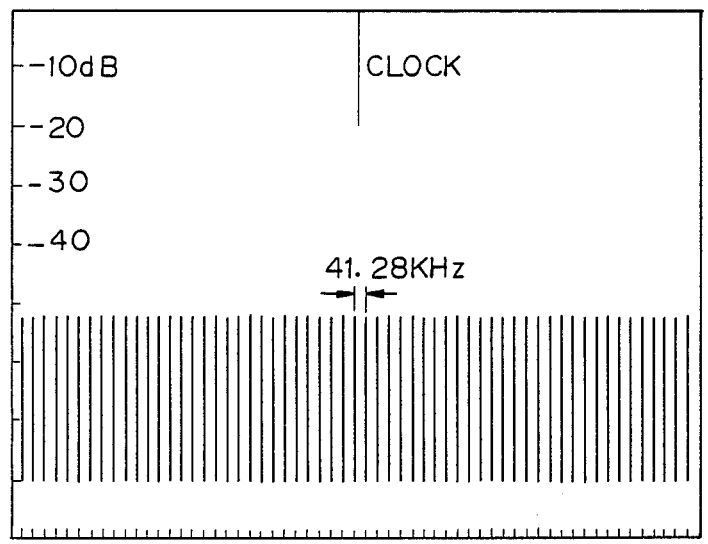
FIGS. 6 and 7 are diagrams showing the spectrum of the clock data.
Figure 7:
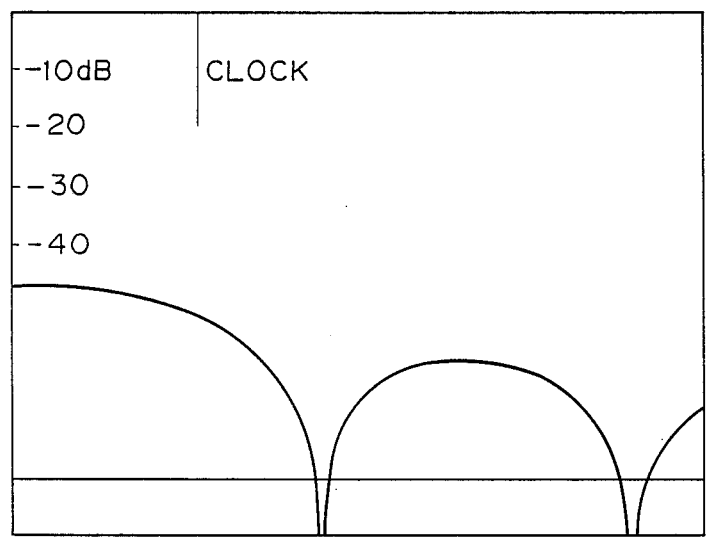
Figure 8:
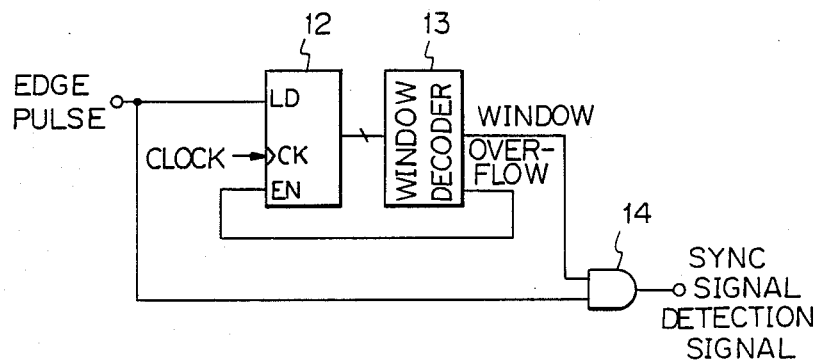
FIG. 8 is a block diagram showing the construction of a conventional synchronizing signal generator system.
Figure 9:
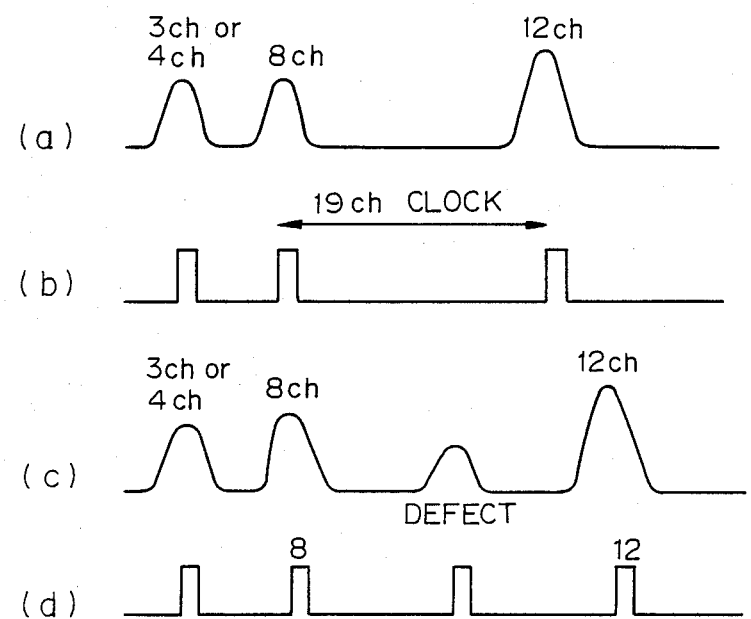
FIGS. 9a through d is a timing chart showing the operation of the system shown in FIG. 8.

FIG. 12 is a block diagram showing a clock generator circuit of the present invention. Parts therein corresponding to those in the organization of FIGS. 2 through 4 are denoted by like reference numerals. In the present invention, however, the oscillating frequency in the voltage-controlled oscillator circuit 11 is set to 22.29 MHz and the frequency dividing ratio of the frequency divider circuit 90 is set to two. If the oscillating frequency is set to 11.1456 MHz, the frequency divider circuit 90 is not necessarily required.

Therefore, it follows that the phase comparator circuit 80 compares the phases of the clock data whose frequency is 41.28 KHz and the clock whose frequency is 11.1456 MHz.

Figure 14:
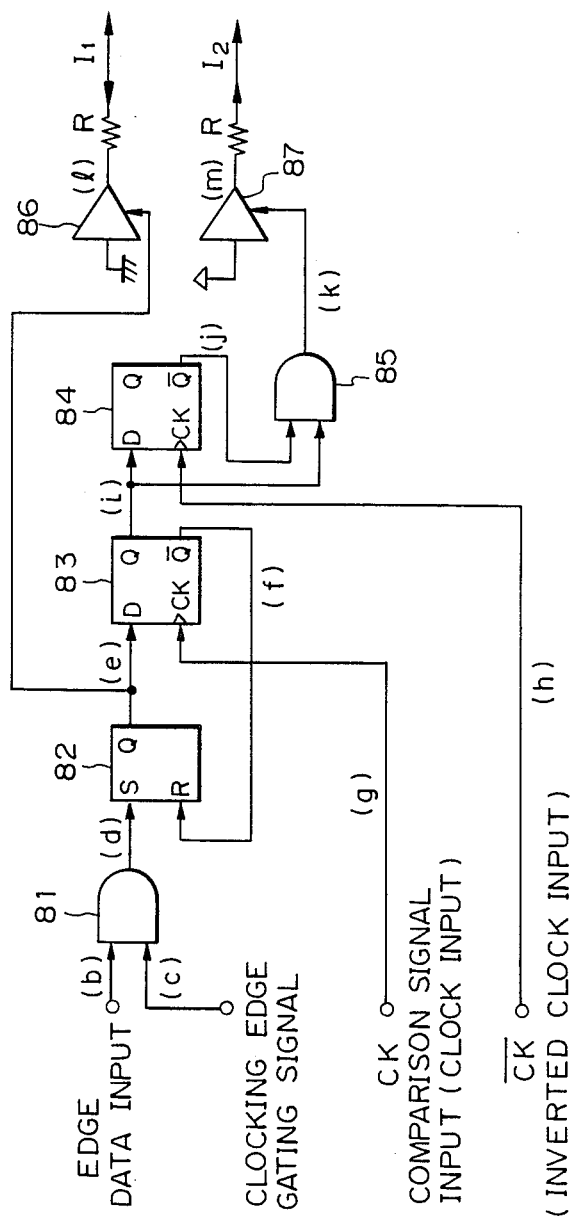
FIG. 14 is a block diagram showing the construction of a phase comparator circuit according to the present invention.

FIG. 14 is a block diagram of the phase comparator circuit 80 of the present invention. As the spot light traces the vicinity of the clock pit, an RF signal whose waveform is as indicated in FIG. 15(a) is obtained. That is, the reflected light from the clock pit portion or a portion where there is present a flaw or dust decreases in quantity and the level of the RF signal corresponding to the quantity of the received light is lowered. If the RF signal is differentiated by a circuit not shown and thereby its edge information is detected, and edge data signal (input signal) as indicated in FIG. 15(b) is obtained. Also, as described in the foregoing, a timing signal generator circuit (not shown) based upon a detected synchronizing signal generates a gate signal (FIG. 16(c)) for gating the edge data signal. Since the edge data signal and the gate signal are input to an AND gate 81, the pulse produced by dust, flaw, or the like is not output from the AND gate 81 but the edge data signal (at 41.28 KHz) only is output therefrom (FIG. 15(d)).

The output of the AND gate 81 is input to an R-S flip-flop 82, whereby the flip-flop 82 is set at its leading edge (FIG. 15(e)). The output of the flip-flop 82 is input to the data terminal of a delay flip-flop 83 operating as a latch circuit. Since its clock terminal is supplied with an input of a clock (for example, at 11.1456 MHz) as a reference signal for comparison, the flip-flop 83 latches the da&a at the data terminal at the timing of the leading edge of the clock (FIG. 15(f), (i)). The output terminal $\overline{Q}$ of the flip-flop 83 is connected with the reset terminal of the flip-flop 82 whereby a generator circuit is constructed. Since it is reset by the trailing edge of the output $\overline{Q}$ (FIG. 15(f)) of the flip-flop 83, the flip-flop 82 outputs a pulse (FIG. 15(e)) whose Width corresponds to information about the time difference (phase) between the edge data and the clock.

During the time when a high level signal (enable signal) 18 input from the flip-flop 82, a three-state buffer 86 is put in an enabled state and outputs a low level signal (FIG. 15(l)). This signal is converted by means of a resistor R into a current $I_1$ of one polarity flowing therethrough. The current $I_1$ is supplied to a low-pass filter 10 constituting a portion of a PLL circuit generating the clock. When a low level signal is input from the flip-flop 82, the buffer 86 is kept in an open state.

The output Q (FIG. 15(i)) of the flip-flop 83 is input to the data terminal of a delay flip-flop 84 as a latch circuit. Since its clock terminal is supplied with the clock of inverted phase (FIG. 15(h)), the flip-flop 84 latches the output Q of the flip-flop 83 (FIG. 15(j)) at the timing of the other edge of the clock. Since the output Q of the flip-flop 83 and the output $\overline{Q}$ of the flip-flop 84 are input to an AND gate 85 as a generator circuit, the AND gate 85 outputs a pulse (FIG. 15(k)) which corresponds to the width between one edge and the other edge of the clock.

A three-state buffer 87 is kept in an enabled state while a high level signal (enable signal) is input thereto from the AND gate 85 and outputs a signal (at high level) of the opposite polarity to that of the buffer 86 (FIG. 15(m)). This signal is converted by means of a resistor R into a current $I_2$ flowing therethrough of the opposite polarity to that of the aforementioned current. This current $I_2$ is also supplied to the low-pass filter 10.

The output of the flip-flop 82 corresponds to the time difference between the edge of the clock data and the edge of the clock, while the output of the AND gate 85 corresponds to $\frac{1}{2}$ of the period of the clock (the width between one edge and the other edge). Although it is possible to output only the output of the flip-flop 82 as the result of phase comparison, it becomes possible to provide a result of phase comparison independent of the repetition period of the edge (clock data) by outputting the difference between the output of the flip-flop 82 and the output of the AND gate 85 through the low-pass filter.

Therefore, even if there is produced a variation in the number of revolutions of the disk, any variation in the result of the phase comparison can be prevented from occurring. It is also possible to make a phase comparison of a signal whose edge spacing varies.

Further, since only a single edge is used as the information for the phase comparison, even if the pulse width varies as indicated by broken line in FIG. 15(b), the result of the comparison is not thereby varied.

Besides, since the buffers 86, 87 are put into the enabled state only during the other period and held in the open state during the other period, the operation to hold a result of a phase comparison made in the sampling (enabled) period for another (open) period, namely, a sample and hold operation, is provided by the phase comparator circuit itself.

Figure 15:
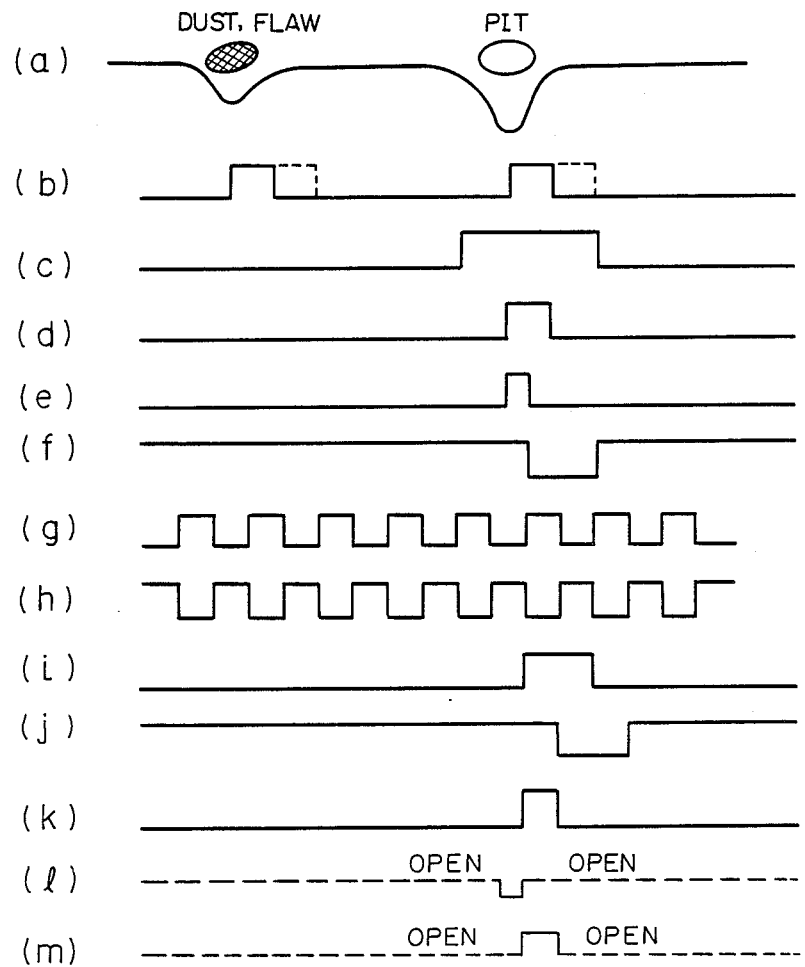
FIGS. 15a through m is a timing chart showing the operation of the circuit shown in FIG. 14.
Figure 16:
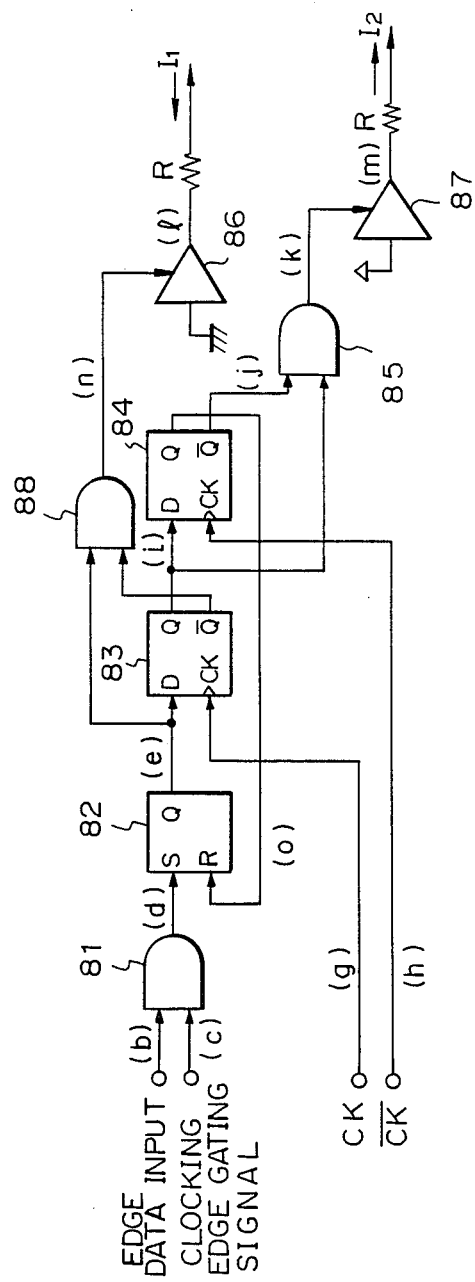
FIG. 16 is a block diagram showing the construction of another embodiment of the phase comparator circuit according to the present invention.
Figure 17:
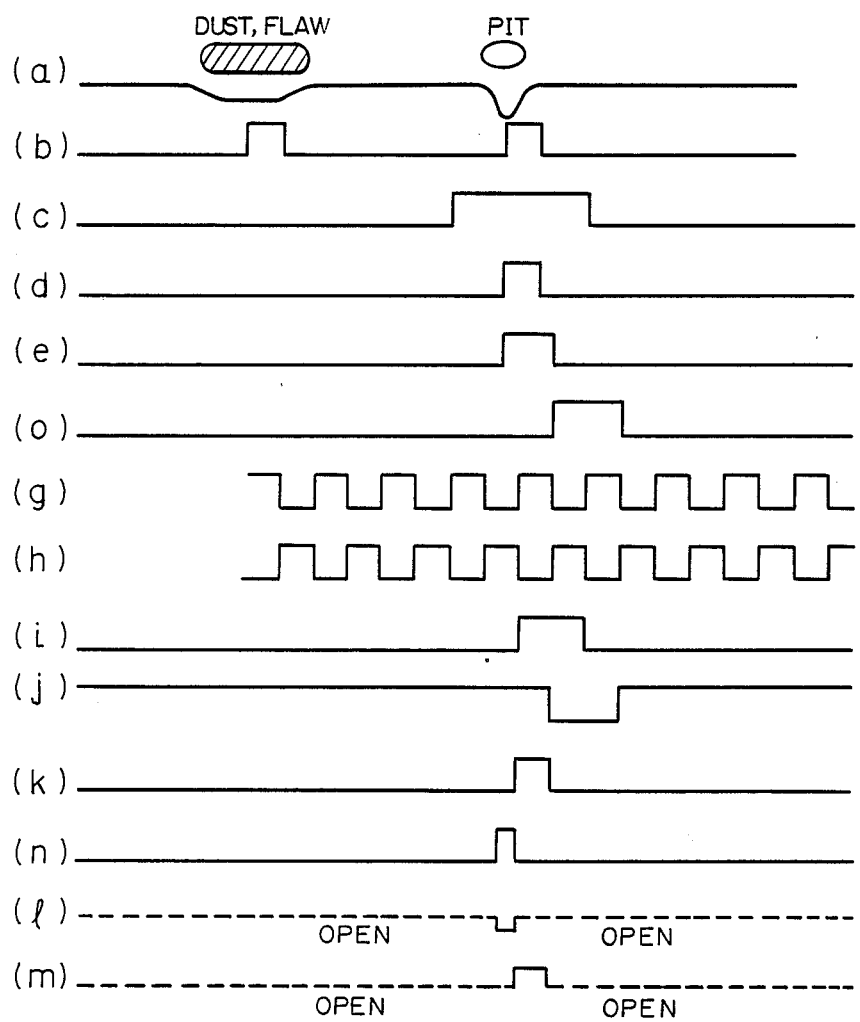
FIGS. 17a through m is a timing chart showing the operation of the circuit shown in FIG. 16.
Figure 18:
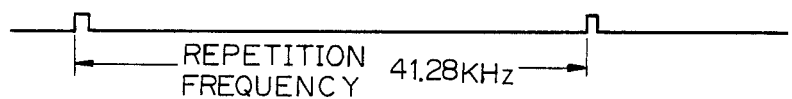
FIG. 18 is an explanatory diagram showing the clock data.

FIG. 16 is a block diagram of another embodiment of the phase comparator circuit 80 and FIG. 17 is a timing chart for the same (corresponding parts to those in FIGS. 14 and 15 are denoted by like reference numerals). In the present embodiment, the flip-flop 82 is reset by the output Q of the flip-flop 84 (FIG. 17(o)) and the output of the flip-flop 82 and the output d of the flip-flop 83 are input to an AND gate 88 serving as a generator, whereby a time difference information signal (FIG. 17(n)) is generated and output.

In the case of the embodiment of FIG. 14, the minimum time difference of the signal output from the flip-flop 82 is regulated by the sum of the time for data setting up in the flip-flop 82, the delay time in the flip-flop 83 until the output $\overline{Q}$ is generated after the clock has been input thereto, and the time elapsed in the flip-flop 82 until the output Q is inverted after the resetting signal is input thereto. In contrast, in the case of the embodiment of FIG. 16, it is regulated by the sum of the time for data setting up in the flip-flop 82 and the delay time in the flip-flop 83 until the output $\overline{Q}$ is delivered therefrom after the clock is input thereto. Therefore, the embodiment of FIG. 16 operates faster.

Although three-state buffers 86, 87 are used in the output circuits of the aforementioned embodiments, it is also possible to arrange a current power source to be switched such that the current is output only during the period when the phase comparison output is delivered.

Thus, by the PLL circuit consisting of the phase comparator circuit 80, low-pass filter 10, voltage-controlled oscillator circuit 11, and the frequency divider circuit 90, a clock at 11.1456 MHz is generated in synchronism with the clock data at 41.28 KHz.

As described so far, the phase comparator circuit according to the present invention comprises a flip-flop to be set by an input signal, a first latch circuit for latching an output of the flip-flop at the timing of one edge of a clock, a second latch circuit for latching an output of the first latch circuit at the timing of the other edge of the clock, a first generator circuit for generating, from the outputs of the flip-flop and of the first latch circuit, a first pulse corresponding to information about the time difference between the input signal and the clock, and a second generator circuit for generating, from the outputs of the first latch circuit and of the second latch circuit, a second pulse corresponding to the width between one edge and the other edge of the clock. And therefore, it can achieve a phase comparison for an input signal having information of the only a single edge.

Referring to FIG. 12 again, reference numeral 60 denotes a detector circuit The detector circuit 60 is supplied With the clock at 11.1456 MHz output from the frequency divider circuit 90 and a signal synchronized with the clock data such as a synchronizing signal (which may be the clock data itself as indicated by broken line in the figure).

Figure 13:
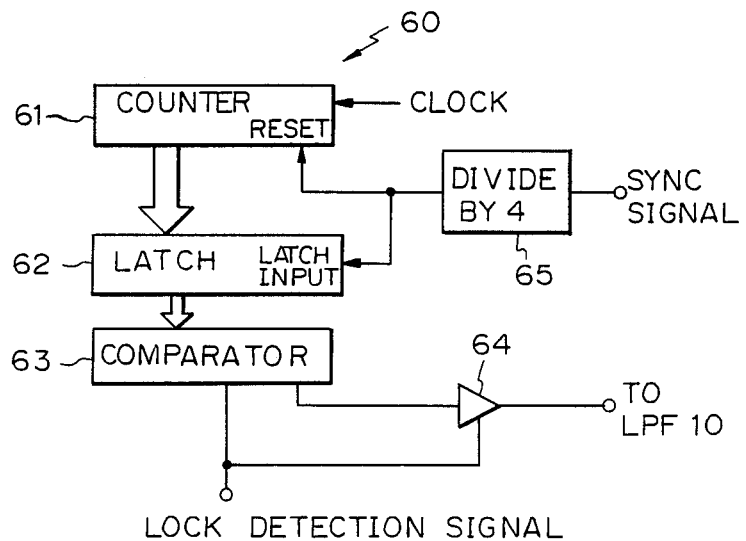
FIG. 13 is a block diagram showing the construction of the detection circuit shown in FIG. 12.

FIG. 13 shows an example of the detector circuit 60. To improve accuracy in the detection, the synchronizing signal (being at 41.28 KHz the same as the clock data) is input to a frequency divider circuit 65 whereby the frequency is divided by four. The detector circuit 65 outputs a pulse of a predetermined width at the timing of the frequency divided by four (at a repetition frequency of 10.32 KHz). The pulse is input to a counter 61 for counting the clock pulses, and the counter 61 transfers its count value to a latch circuit 62 at the timing of the leading edge of the pulse input thereto, resets the count value at the timing of the trailing edge, and starts its new counting operation. The counter 61 thus detects the pulse spacing of the synchronizing signal (spacing multiplied by four in the present case) by counting the clock pulses. Since the clock frequency is 11.1456 MHz, the spacing of the synchronizing signal (41.28 KHz) corresponds to 270 clock pulses in the formal state. When the PLL circuit is mis-locked onto a spectrum of 11.1456 MHz±41.28 N KHz, the aforesaid value becomes 270 ±$M_1$ clock pulses. Since the frequency is divided by four now, the count value C of the counter 61 becomes 1080 ±M. If the lock range of the PLL circuit is set to be between 1077 and 1083, the count value being less than 1077 or more than 1083 indicates an off-the-lock state.

The value C transferred from the counter 61 and latched in the latch circuit 62 is compared with the reference values in a comparator circuit 63. When the count value C is between 1077 and 1083, the comparator circuit 68 outputs, for example, an H signal as a lock detection signal and outputs an L signal when it is out of the range. The lock detection signal is supplied to a three-state buffer 64 also as a control signal therefor. When the H signal is input, the buffer 64 is put into an open state, and at this time, no disturbance signal (frequency control signal) is supplied to the low-pass filter 10.

When the L signal is input, the buffer 64 is put into an enabled state. At this time, the comparator circuit 63 causes the buffer 64 to output, for example, an L signal when the count value 0 is smaller than 1077 and to output an H signal when it is larger than 1083. This output from the buffer 64 is supplied through the low-pass filter 10 to the voltage-controlled oscillator circuit 11 and thereby raises or lowers its oscillating frequency.

The driving power of the PLL circuit by the output of the buffer 64 is set to be larger than the driving power by the output of the phase comparator circuit 80. As a result, when the output of the buffer 64 is input the PLL circuit is·quickly driven to the frequency within the lock range. Although the phase comparator circuit 80 compares phases of the data clock and the clock at mutually different frequencies, mislocking onto a different spectrum is prevented since the o PLL circuit has the frequency controlling loop.

Instead of providing the difference in the driving force, it may be arranged such that the output of the phase comparator circuit 80 is substantially shut off while an output is delivered from the buffer 64.

Further, when the clock data does not come inside the gate pulse, and therefore is not input to the phase comparator circuit 80, it is preferred that a protection operation is provided such that the operation of the detector circuit 60 is substantially inhibited by shutting off the output, or the operation for the preceding servo byte is held as it is. Thereby, it is prevented that the oscillating frequency of the voltage-controlled oscillator circuit 11 becomes extremely high or low.

Although, in the foregoing, the latch circuit 62 and the comparator circuit 63 were adapted to serve as a supply circuit to generate and output a signal corresponding to the count value of the counter 61, it is also possible to use, for example, a D/A converter as a supply circuit so that the count value is thereby D/A converted and output to the low-pass filter 10.

As described so far, the present invention, in a clock generator circuit, comprises a PLL circuit consisting of a phase comparator circuit for comparing phases of clock data and a clock at a frequency different from that of the clock data, a low-pass filter for smoothing the output of the phase comparator circuit, and a voltage-controlled oscillator circuit controlled in response to the output of the low-pass filter for generating the clock, a counter detecting the pulse spacing of the clock data or a signal synchronized with the clock data by counting the clock pulses, and a supply circuit for supplying the PLL circuit with a signal corresponding to the count value of the counter, and therefore, mis-locking onto a different spectrum is prevented and generation of a correct clock is made possible.

What is claimed is:

1. A recording-reproducing clock generator circuit for generating a reproduced clock having a predetermined frequency from a read out signal which includes such pulses that the interval between two successive pulse thereof at a predetermined length is to be used as a synchronizing signal region, said reproduced clock signal synchronized with clock edge pulses located at predetermined positions with reference to said synchronizing signal region, said recording-reproducing clock generator circuit comprising:

first clock generator means for generating a reference clock at a predetermined frequency;

first sync detector means for generating a first sync signal detection signal when a value obtained by measuring the distance between two successive pulses in the input signal by means of said reference clock is equal to a predetermined value;

separating means for separating the clock edge pulses from the input signal according to said first sync signal detection signal and outputting the pulses; and second clock generator means for generating a reproduced clock having the predetermined frequency in synchronism with said clock edge pulses outputted from said separating means.

2. A recording-reproducing clock generator circuit as set forth in claim 1, wherein said second clock generator means comprises a phase locked loop circuit including; a phase comparator circuit for comparing phases of said clock edge pulses and said reproduced clock having a frequency different from frequency of said clock edge pulse, and a frequency control circuit for controlling the frequency of said reproduced clock by supplying said phase locked loop circuit with a signal corresponding to the value of the distance between said clock edge pulses measured by means of said reproduced clock.

3. A recording-reproducing clock generator circuit as set forth in claim 1, wherein said separating means comprises; means for generating a second sync signal detection signal when the value of the distance between two successive pulses in the input signal measured by means of said reproduced clock is equal to a predetermined value, and means for generating a synchronization completion signal when said second sync signal detection signals are generated a predetermined number of times in succession at intervals of a predetermined distance, and wherein said separating means is adapted such that, while said synchronization completion signal is existing, the clock edge pulses are separated from the input signal according to said second sync signal detection signal.

\* \* \* \* \*